United States Patent [19]
Williams

[11] Patent Number: 5,898,895
[45] Date of Patent: Apr. 27, 1999

[54] SYSTEM AND METHOD FOR CONTROLLING DATA TRANSMISSION RATES BETWEEN CIRCUITS IN DIFFERENT CLOCK DOMAINS VIA SELECTABLE ACKNOWLEDGE SIGNAL TIMING

[75] Inventor: David Paul Williams, Mounds View, Minn.

[73] Assignee: Unisys Corporation, Blue Bell, Pa.

[21] Appl. No.: 08/728,450

[22] Filed: Oct. 10, 1996

[51] Int. Cl.⁶ .............................. H04L 7/04; G06F 13/42; G06F 1/04
[52] U.S. Cl. ...................... 395/880; 395/848; 395/849; 395/878; 395/308; 395/555
[58] Field of Search .................... 395/848, 849, 395/880, 878, 308, 555

[56] References Cited

U.S. PATENT DOCUMENTS

| | | | |
|---|---|---|---|
| 4,613,936 | 9/1986 | Andresen | 395/555 |
| 5,191,657 | 3/1993 | Ludwig et al. | 395/285 |
| 5,237,670 | 8/1993 | Wakerly | 395/280 |
| 5,293,603 | 3/1994 | MacWilliams et al. | 395/309 |
| 5,379,386 | 1/1995 | Swarts et al. | 395/309 |
| 5,404,522 | 4/1995 | Carmon et al. | 395/677 |
| 5,418,930 | 5/1995 | Swarts | 395/500 |
| 5,444,858 | 8/1995 | Wakerly | 395/304 |
| 5,546,546 | 8/1996 | Bell et al. | 395/280 |
| 5,625,892 | 4/1997 | Bauman et al. | 455/69 |
| 5,774,681 | 6/1998 | Kunishige | 395/308 |

*Primary Examiner*—Mark R. Powell
*Assistant Examiner*—Jeffrey Allen Rossi
*Attorney, Agent, or Firm*—Charles A. Johnson; Mark T. Starr; Merchant, Gould, Smith, Edell, Welter and Schmidt

[57] ABSTRACT

A system and method for providing speed-regulated data transmission between two synchronous systems in different clock domains. A first synchronous circuit includes a memory device, and a second synchronous circuit includes one or more data-requesting devices. The first synchronous circuit operates at a greater clock speed than the clock speed of the second synchronous circuit. A read request buffer queues read request signals from the data-requesting devices, and outputs one of the read request signals to the memory device. A pulse generator receives the read request signal which was output from the queue, and generates a plurality of signal pulses in response thereto. Each of the pulses occurs at a different predetermined time from the occurrence of the read request signal. One of the pulses is selected to be the read acknowledge signal, and assertion of the read acknowledge signal allows the read request buffer queue to output another read request signal.

29 Claims, 7 Drawing Sheets

PRIOR ART

SYSTEM AND METHOD FOR CONTROLLING DATA TRANSMISSION RATES BETWEEN CIRCUITS IN DIFFERENT CLOCK DOMAINS VIA SELECTABLE ACKNOWLEDGE SIGNAL TIMING

BACKGROUND OF THE INVENTION

1. Field of the Invention

This invention relates generally to data transmission systems, and more particularly to an asynchronous interface for allowing speed-regulated data transmission between two synchronous systems in different clock domains.

2. Description of the Prior Art

Connections of input/output (I/O) systems and central computing complexes (including processing units and memory devices) have often required the use of asynchronous interfaces. It is known that various I/O devices and systems are designed to be used in conjunction with these central computing complexes, however the I/O devices are typically independently designed, and operate at different system clock speeds than the central computing complex. The different system clock speeds of the I/O and the central computing complex have given rise to the use of the asynchronous interface, to allow these synchronous circuits to communicate effectively.

One asynchronous interface method is to use memory buffers in both the I/O system and the central computing complex. These memory buffers temporarily stored additional data transfer requests while waiting for current operations to be completed. Other memory buffers temporarily stored transmitted data which could not yet be handled by the recipient circuit. However, use of these buffers requires complex address counters and pointers, detectors for detecting whether the buffer is empty or full, and queue compression logic. Furthermore, these buffers require large amounts of valuable real estate on the chip. It is therefore desirable to provide an interface between the input/output devices and the memory without the use of the large amount of memory buffers.

U.S. Pat. No. 5,191,657, issued to Ludwig et al. on Mar. 2, 1993, discloses an asynchronous bus interface interposed between independent synchronous buses. However, Ludwig et al. does not appear to provide for an asynchronous interface which can delay the transfer of data depending on the relative speeds of the different synchronous systems. The present invention allows this delay to be easily modified according to changing relative clock rates of the synchronous systems. This provides for ease in coupling a particular I/O system to various different memory systems, and further provides for a modifiable asynchronous interface that is greatly beneficial during clock margin testing.

There is a need, therefore, for an asynchronous bus interface that provides flexibility in changing data transfer rates between two systems clocked at different clock rates, and further for an asynchronous bus interface that avoids the need for large amounts of memory buffers which consume valuable chip real estate. The present invention provides a solution to these and other problems, and offers other advantages over the prior art.

OBJECTS

It is a primary object of this invention to provide an improved asynchronous interface between modules in different clock domains.

It is another object of the invention to allow a common input/output system to be coupled to memory systems of differing clock speeds.

It is yet another objective to provide a common input/output system having flexibility to change the data transfer rate of data read from a memory system.

It is still another object to provide a modifiable interface delay to set the speed of the asynchronous interface to allow data to be transferred from the memory system at an acceptable clock rate for the requesting input/output system.

It is another object of the invention to reduce the data transfer rate from the memory system to the input/output system, where the input/output system is operating at a slower clock speed than the memory system.

It is yet another object of the invention to reduce the use of memory buffers, thereby reducing real estate and other control circuitry required for prior art asynchronous interfaces.

It is still another object to provide flexibility in performing clock margin testing.

Other more detailed objectives will become apparent from a consideration of the Drawings and the Detailed Description of the Preferred Embodiment.

SUMMARY OF THE INVENTION

The present invention relates to a system and method for providing speed-regulated data transmission between two synchronous systems in different clock domains.

In accordance with one embodiment of the invention, an apparatus for limiting the data transfer rate between first and second synchronous circuits is provided. The first synchronous circuit includes a memory device, and the second synchronous circuit includes one or more data-requesting devices. The first synchronous circuit operates at a greater clock speed than the clock speed of the second synchronous circuit. A read request buffer queues read request signals from the data-requesting devices, and outputs one of the read request signals to the memory device. A pulse generator receives the read request signal which was output from the queue, and generates a plurality of signal pulses in response thereto. Each of the pulses occurs at a different predetermined time from the occurrence of the first read request signal. One of the pulses is selected to be the read acknowledge signal, which allows the read request buffer queue to output another read request signal.

In accordance with another embodiment of the invention, a system for allowing data transfers from a memory device in a first clock domain to requesting input/output devices in a second clock domain is provided. The first clock domain has an operating clock speed which is greater than the operating clock speed of the second clock domain. The system includes a bridging circuit to receive data request signals from requesting input/output (I/O) devices. A data uplink module includes a request buffer to queue the data request signals, and further includes an output terminal to systematically output the data request signals to the memory device. A data downlink module transfers requested data from the memory device to the bridging circuit. The data downlink module also receives a data request signal, and generates a read acknowledge signal in response to the data request signal. The read acknowledge signal is generated at a predetermined time from the occurrence of the data request signal, and this predetermined time can be modified to correspond to the amount of data transmission delay desired. Upon receiving the read acknowledge signal, the request buffer in the data uplink module is enabled to output another one of the data request signals to the memory device.

In accordance with yet another embodiment of the invention, a method for allowing data transfers from a memory device to one or more data requesting devices is provided. The memory device and the data requesting devices reside in different clock domains. A read request signal is simultaneously sent from the data requesting devices to the memory device and the data transfer module. The requested data is transferred from the memory device to the data transfer module when the memory device receives the read request signal. At a predetermined time after receipt of the read request signal at the data transfer module, a read acknowledge signal is generated. When this read acknowledge signal is issued, another one of the read request signals is enabled to be sent to the memory device and the data transfer module.

Still other objects and advantages of the present invention will become readily apparent to those skilled in this art from the following detailed description, where the preferred embodiment of the invention is shown by way of illustration of the best mode contemplated of carrying out the invention. As will be realized, the invention is capable of other and different embodiments, and its details are capable of modification without departing from the invention. Accordingly, the drawing and description are to be regarded as illustrative in nature, and not as restrictive.

DETAILED DESCRIPTION OF THE PREFERRED EMBODIMENT

Figure 1:
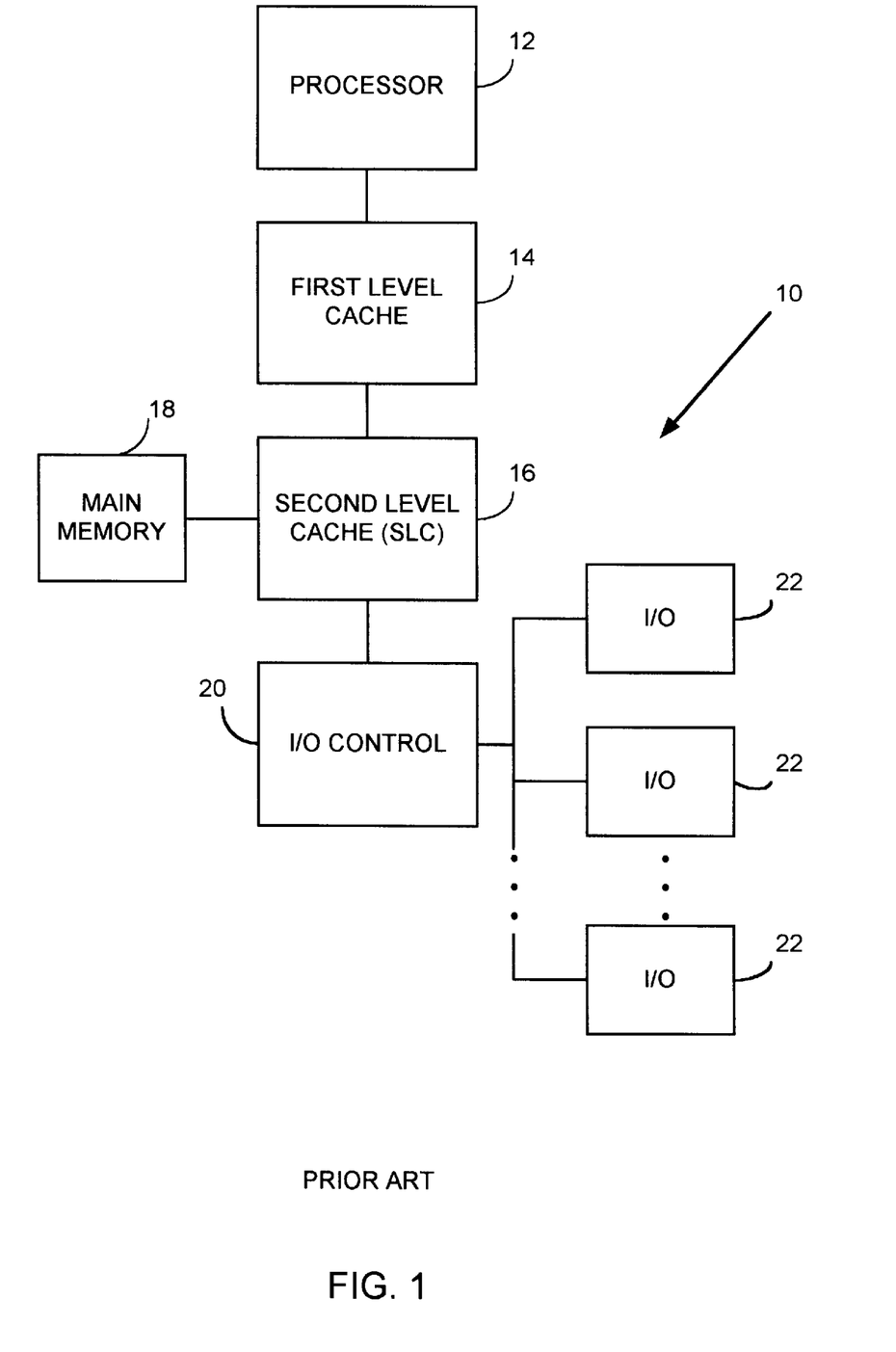
FIG. 1 is a diagram of a prior art computing system having multiple input/output devices.

FIG. 1 is a diagram of a prior art computing system 10 having multiple input/output devices. The processor 12 represents a computer processing unit, which performs the processing functions within the computer system 10. The processor 12 is typically coupled to a first level cache 14 which is a cache memory nearest the processor 12. Such a first level cache is typically dedicated to a particular processor in the computing system 10, and is used to provide fast-access memory accesses for instructions and operands associated with that particular processor. Typically in a processing system such as computing system 10 is a second level cache (SLC) which is the main system cache for computing system 10. The SLC is a cache memory that is shared between multiple processors in a multiprocessor data processing system. When attempts to access cache memory fail, data is transferred to and from a main memory 18, which although slower in speed than the first and second level caches, is typically capable of storing much greater amounts of data.

The input/output (I/O) control 20 is the interface from the processing unit and memory to peripheral devices generically labeled I/O 22. The I/O control 20 provides the I/O 22 with a means to read data from memory locations in the first level cache 14, the second level cache 16, or the main memory 18. The I/O control 20 also allows data to be written from one of the peripheral devices to caches 14 or 16 or main memory 18.

The nature of peripheral devices, i.e., the I/O devices 22, is often that of an "add-on" device to a system. Therefore, I/O devices are often independently designed from the processing and memory systems in which they are coupled to. In fact, I/O systems are most often physically separated from the processing and memory systems, typically connected via cables or backplanes. Because of this independent nature of the I/O devices 22, they are often designed to operate at clock speeds which are different from the clocks speeds driving the processor 12 the first and second level caches 14 and 16, and the main memory 18. These two independently synchronous systems must be coupled in a manner which allows the two systems to communicate with each other notwithstanding their different synchronous clocking speeds.

Figure 2:
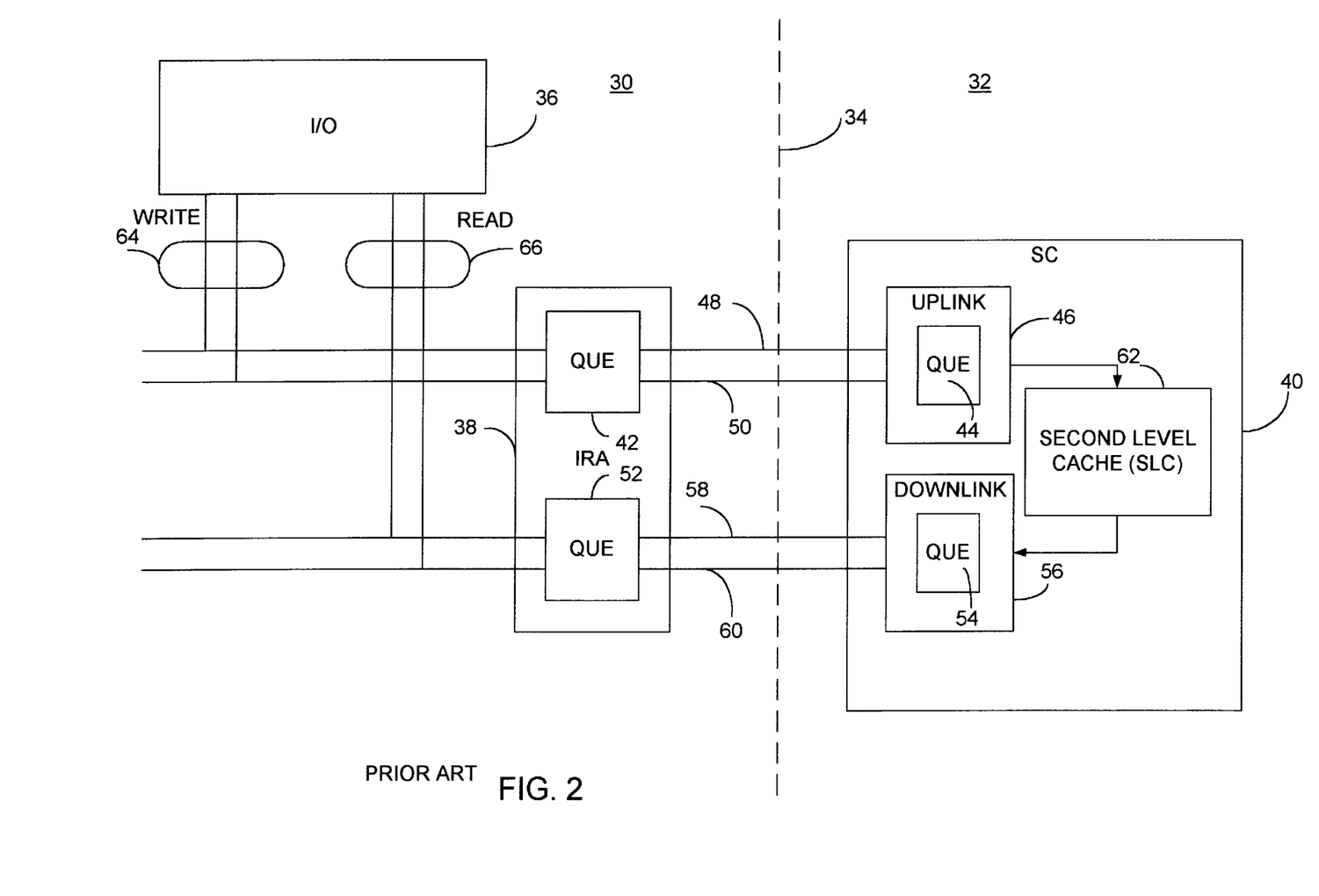
FIG. 2 is a block diagram of a prior art interface between an I/O system and a memory system residing in different clock domains.

Referring now to FIG. 2, a diagram of a prior art interface between an I/O system and a memory system residing in different clock domains is provided. A clock domain is a portion of a circuit which is controlled by a common clock signal at a particular clock speed. The different clock domains in FIG. 2 are shown as clock domains 30 and 32. Clock domains 30 and 32 are shown to be separated by clock domain boundary 34. The circuitry within clock domain 30 is therefore clocked at a first clock speed, while the circuitry residing in clock domain 32 is clocked at a second, or different, clock speed.

The circuitry within clock domain 30 in FIG. 2 includes one or more I/O devices 36 and an I/O Remote Adapter (IRA) 38. The IRA 38 in FIG. 2 provides an asynchronous interface with the storage controller (SC) 40 in clock domain 32. One asynchronous interface is shown between the queue 42 in the IRA 38, and the queue 44 in the uplink module 46. The interface lines are shown as lines 48 and 50, which consist of two data request lines—one for even data words, and one for odd data words. Similarly, the queue 52 in IRA 38 and the queue 54 in the downlink module 56 comprise the other asynchronous interface. The interface lines are shown as lines 58 and 60, which again consist of a data request line for even data words, and a data request line for odd data words.

The IRA 38 provides an interface between the I/O 36 and the storage controller (SC) 40. The I/O device 36 can request to write data to the SLC 62 by way of the odd and even write lines 64, or can alternatively request to read data from the SLC 62 by the odd and even read request lines 66.

The prior art system of FIG. 2 contained many data buffers as evidenced by queues 42, 44, 52, and 54. These data buffers, or queues, temporarily store the data between read and write cycles between the I/O system and the memory system in order to properly transmit the data asynchronously. For instance, queue 42 in the IRA 38 temporarily stores packets of data before sending them to the uplink module 46, and queue 44 in the uplink module 46 temporarily holds the data packets while waiting for the current memory transaction to be completed. A queue 54 in the downlink module 56 is used when the I/O device 36 makes a request to read data from the SLC 62, and similarly a queue 52 and the IRA 58 buffers the read data from the SLC 62 back to the I/O device 36. The buffering in queues 54 and 52 are often required because the clock speed in clock domain 32 is much greater than the clock speed in the clock domain 30. In other words, memory systems can typically be clocked faster, and therefore operate faster, than peripheral I/O systems.

The data buffering represented by queues 42, 44, 52, and 54 consume large amounts of valuable electronic real estate. In fact, the large number of buffers required in a system such as the prior art of FIG. 2 often require multiple ASICs (Application-Specific Integrated Circuits). Such buffering is required however, because the clock speeds in clock domain 32 are fast enough with respect to the clock speeds in clock domain 30, that the storage controller 40 will be sending data across the interface faster than it can be handled on the I/O side. The present invention provides this interface between the I/O system and the memory system, without the need for the large amount of data buffers or queues.

Figure 3:
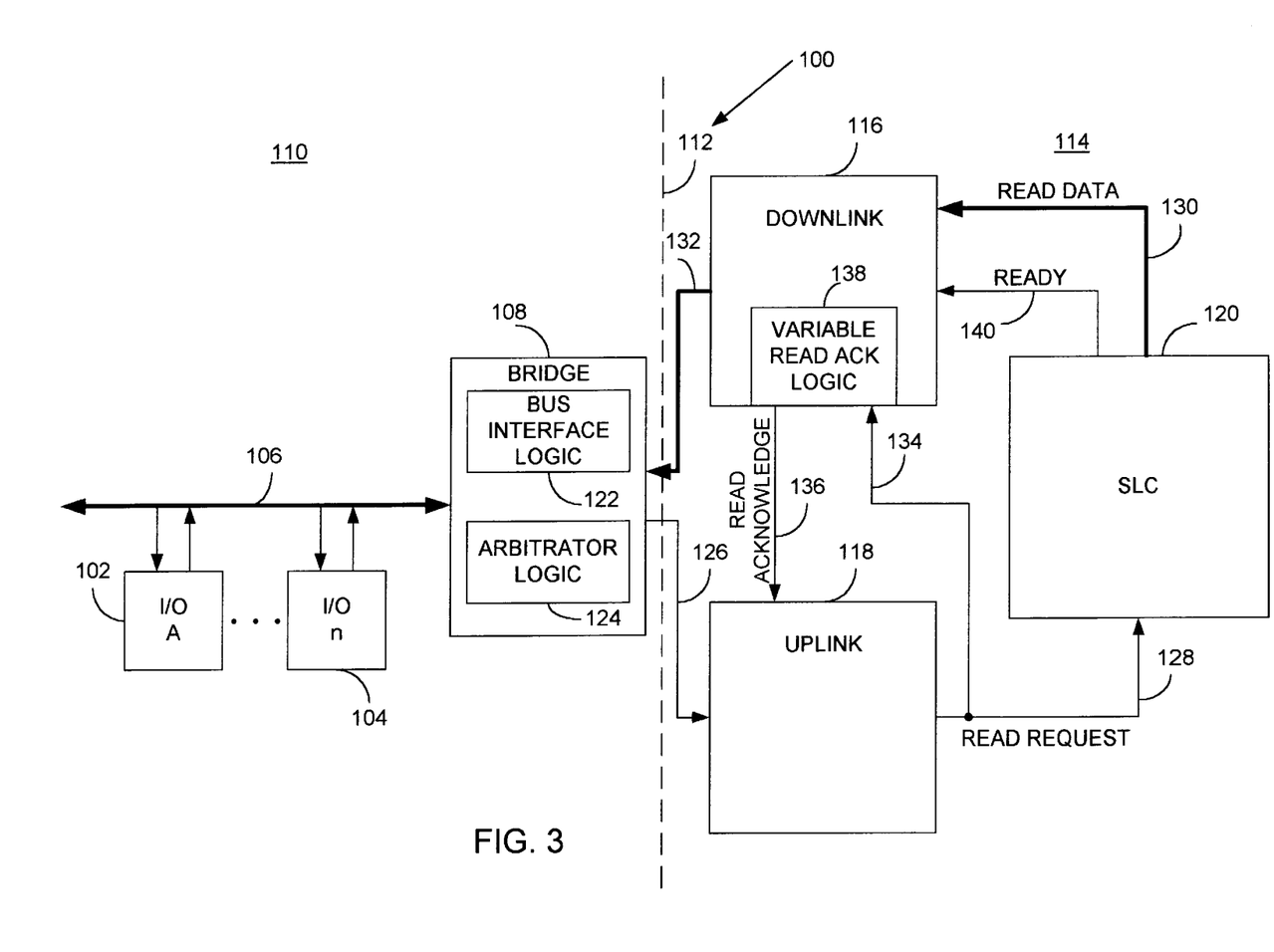
FIG. 3 is a block diagram of the preferred system interface of the present invention.

FIG. 3 is a block diagram of the system interface of the present invention. The system of FIG. 3 provides an asynchronous interface between input/output devices, and the system memory, without the need for a large number of buffers.

The I/O devices, or peripheral devices, can be seen in FIG. 3 as I/O A 102 through I/O n 104. I/O A through I/O n represent multiple input/output devices which are to be interfaced to the memory of the computing system. I/O devices 102 and 104 send read data and write data requests to and from the I/O bus 106, and transmit and receive data in response to these requests. The I/O interface bridge 108 is connected to the I/O bus 106 to allow the I/O devices to communicate with the memory system residing in another clock domain. The I/O devices 102 and 104, the I/O bus 106, and the bridge 108 reside in a first clock domain 110. Across clock domain boundary 112 is clock domain 114, wherein the downlink module 116, the uplink module 118 and the SLC 120 reside. The bridge 108 provides an asynchronous interface across the clock domain boundary 112 so that the I/O devices of clock domain 110 can communicate with the SLC 120 of clock domain 114.

The bridge 108 includes bus interface logic 122, which provides the physical interface between the I/O bus 106 and data transferred to and from the SLC 120. The bridge 108 also includes arbitrator logic 124 to present multiple devices from making bus requests simultaneously. Various different arbitration techniques can be used, including fixed priority schemes, round-robin priority schemes and other schemes.

There are two asynchronous interfaces between the bridge and the circuitry within clock domain 114. The first asynchronous interface is between the bridge 108 and the uplink module 118, and an asynchronous interface between the bridge 108 and the downlink module 116. Each interface includes a request control line for controlling the latching of data, and also includes associated data paths. For example, in FIG. 3, a read request control line 126, for sending read request packets, is shown from the bridge to the uplink 118, which is converted to a read request and sent to the SLC 120 via line 128. The SLC 120 provides data in response to the data read request, and provides this data on the read data bus 130 to the downlink module 116, and thereafter back to the bridge 108 via data bus 132. In the preferred embodiment of the present invention, the read data bus 130 and 132 consists of an 8-word wide data path, followed by one word of status.

This transfer is effected by sending the entire 8 words of data and the one status word from the SLC 120 to the downlink module 116 and thereafter to the bridge 108 in a one block transfer.

The uplink 118 receives the read request control signal on line 126, and sends the associated read request to the SLC 120 on line 128, and also simultaneously sends the read request to the downlink module 116 via line 134. The read request on line 134 to the downlink module 116, and the read acknowledge signal on line 136 work together to match the speed of the SLC 120 to the speed of the I/O bus 106. When the read data is returned to the downlink module 116 via the read data bus 130, the variable read acknowledge logic 138 in the downlink module 116 subsequently provides the read acknowledge signal on line 136 to indicate to the uplink module 118 that another read request can be transferred to the SLC 120 via line 128. This prevents SLC 120 from providing data on buses 130 and 132 faster than the I/O bus 106 is capable of accepting. The read acknowledge signal on line 136 can be delayed in time to most closely match the speed difference between the clock domain 110 and the clock domain 114. Furthermore, the read acknowledge signal on line 136 will not be generated by the variable read acknowledge logic 138 until some time after a ready signal on line 140 is received, which indicates that the SLC 120 is ready to provide more read data.

Figure 4:
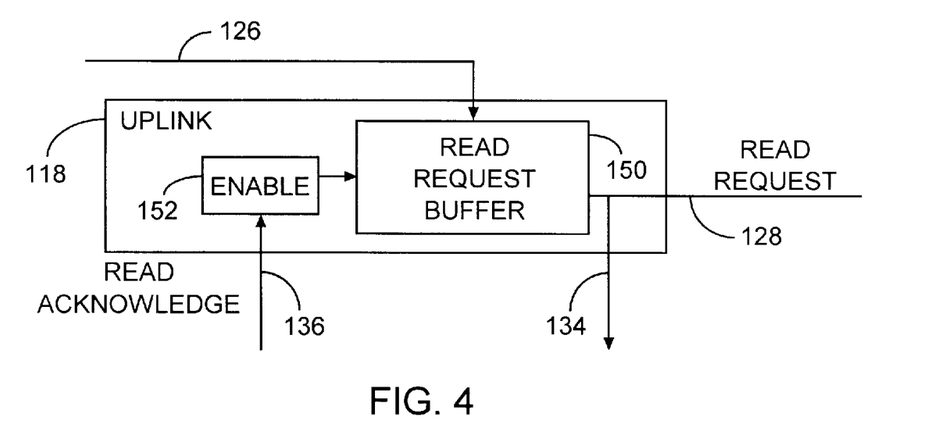
FIG. 4 is a block diagram of the uplink module.

Referring now to FIG. 4, a block diagram of the uplink module 118 is provided. A read request buffer 150 provides a small buffer for read request packets transmitted from the bridge 108 to the uplink module 118 via line 126. This buffer 150 will queue these read requests as the I/O devices 102 through 104 request data from the SLC 120 in clock domain 114. If the buffer 150 becomes filled, the bridge 108 will stop accepting read requests from the I/O devices 102 through 104.

A first read request in buffer 150 will get transferred to its output on lines 128 and 134, and all subsequent read requests in buffer 150 are only transferred to its output on lines 128 and 134 upon receipt of a read acknowledge signal on line 136. When a read acknowledge signal on line 136 is received, an enable circuit 152 enables another read request to be outputted on lines 128 and 134. The enable circuit 152 need only recognize the read acknowledge signal on line 136, and output an enabling signal to the read request buffer 150 in response thereto.

Figure 5:
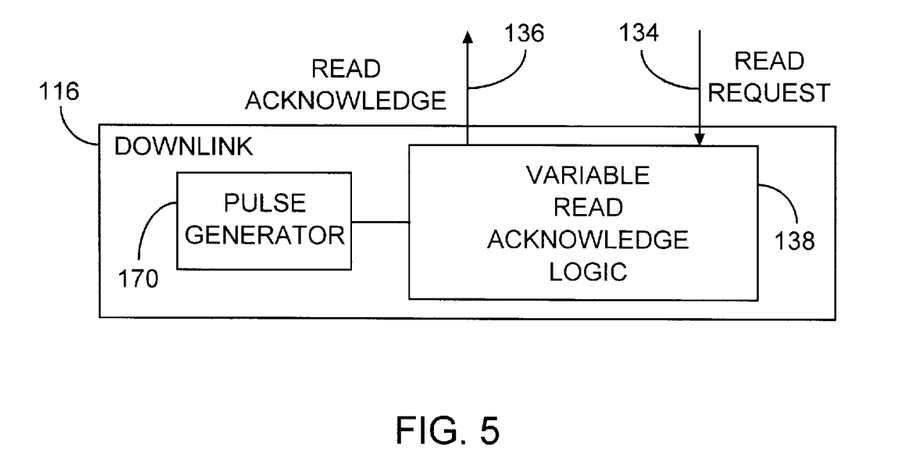
FIG. 5 is a block diagram of the downlink module.

FIG. 5 is a block diagram of the downlink module 116. The downlink module 116 transfers data from the SLC 120 to the bridge 108, and also works cooperatively with the uplink module 118 to match the speed of the SLC 120 to the speed of the I/O bus 106. The downlink module 116 includes the variable read acknowledge logic 138, which receives the read request signal on line 134, and transmits in response thereto the read acknowledge signal on line 136. In generating the read acknowledge signal on line 136, the variable read acknowledge logic 138 accepts one or more clock signal pulses from pulse generator 170. The variable read acknowledge logic 138 provides flexibility in the time that the read acknowledge signal on line 136 is returned to the uplink module 118. Because the uplink module 118 will not output another read request signal to the SLC 120 until a read acknowledge signal on line 136 has been received, delaying the read acknowledge signal delays the next read request signal on line 128, which ultimately reduces the speed in which the SLC 120 provides data back to the I/O devices in clock domain 110.

The aforementioned flexibility in transmitting data from the SLC 120 back to the I/O devices allows I/O systems of varying clock speeds to be coupled to the memory system residing in clock domain 114. Where a slower I/O system were to be coupled to the memory system of clock domain 114, the asynchronous interface between the downlink module 116 and the uplink module 118 can be set to slow the return of data by the SLC 120, so that the I/O devices in the I/O system can keep up with the return of data. Furthermore, clock margin testing is often performed during system test, where the clock speed of the controlling clock signal in each clock domain is increased and decreased to predetermined percentages of its nominal clock speed. The present invention allows data transmission rates to be varied according to the various clock speeds occurring during clock margin testing.

Figure 6:
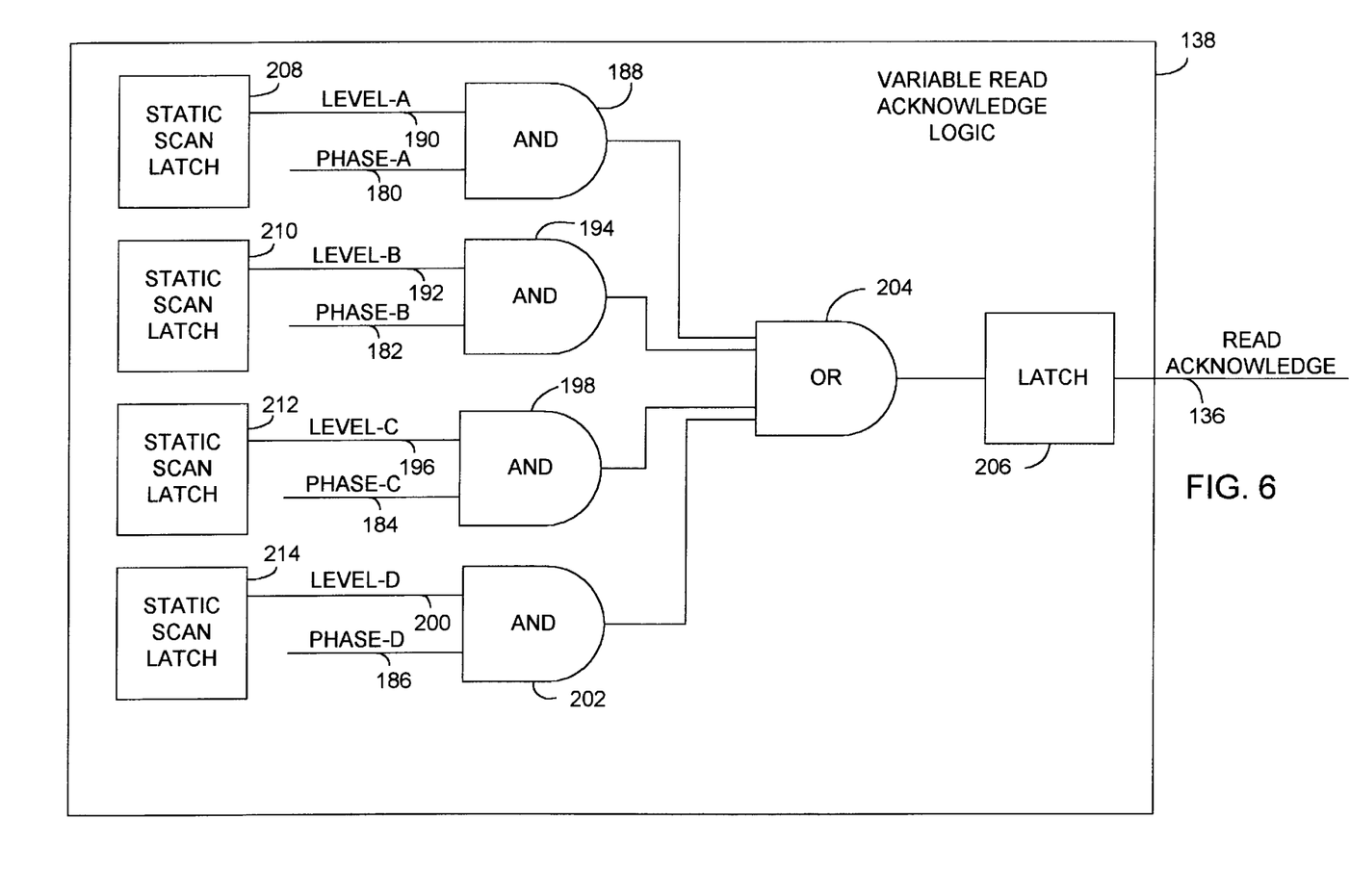
FIG. 6 is a diagram of the components in the variable read acknowledge logic of the preferred embodiment.

FIG. 6 is a diagram of the components in the variable read acknowledge logic 138 of the preferred embodiment. It is this circuit that allows the transmit time of the read acknowledge signal on line 136 to be varied according to the desired speed of data transmission between clock domains 110 and 114.

While four delays were designed into the preferred variable read acknowledge logic 138, it should be recognized that any number of delays could be designed into the variable read acknowledge logic 138 without departing from the scope and spirit of the invention. The four delay signals generated can be seen as the phase-A, phase-B, phase-C and phase-D signals on lines 180, 182, 184 and 186 respectively. Each of these signals is an input to an AND-gate. The phase-A signal on line 180 is input to AND-gate 188, as is the level-A signal on line 190. The phase-B signal on line 182 and the level-B signal on line 192 are the inputs to AND-gate 194. The phase-C signal on line 184 and the level-C signal on line 196 are the inputs to AND-gate 198. Finally, the phase-D signal on line 186 and the level-D signal on line 200 are the inputs to AND-gate 202. The output of each of the AND-gates 188, 194, 198 and 202 are input into OR-gate 204 to be latched into latch 206 as the read acknowledge signal on line 136.

The level-A signal on line 190, the level-B signal on line 192, the level-C signal on line 196, and the level-D signal on line 200 are generated by the static scan latches 208, 210, 212 and 214 respectively. These static scan latches allow one of the particular delay signals on lines 180, 182, 184 and 186 to be selected to be latched into latch 206. The static scan latches are typically used in scan-based testing, which is a test operation where predetermined logic test patterns are serially inputted and shifted to the appropriate scan latch, one or more system clocks are executed to propagate the test patterns through testable logic levels, and then the results are shifted out to be compared to expected values. Generally, therefore, the static scan latches of the present invention allow a predetermined binary value to be loaded into it.

In the preferred embodiment, the loading of a predetermined binary value into the static scan latches takes place during system initialization. One of the static scan latches 208, 210, 212 or 214 will be loaded with a binary value which, when AND-ed with its respective delay signal, will allow that delay signal to pass through to the OR-gate 204 to be latched as the read acknowledge signal on line 136. The level-A, level-B, level-C and level-D signals on lines 190, 192, 196 and 200 are therefore enable signals for allowing it's associated delay signal pass through the corresponding AND-gate. As will be appreciated by those skilled in the art, other types of enable signals could be used. However, the use of the static scan latch in the preferred embodiment provides a means for easily changing the delay signal selection.

Figure 7:
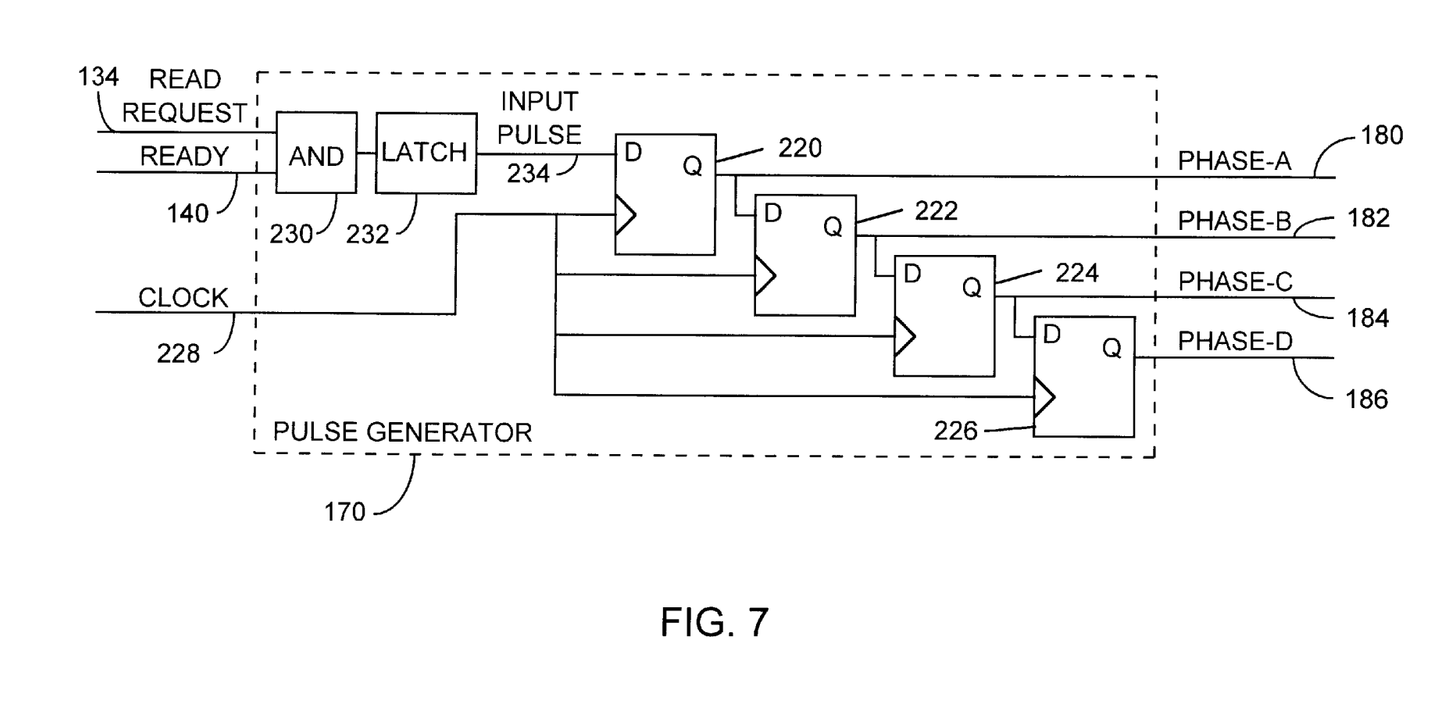
FIG. 7 is a block diagram of one embodiment of the pulse generator which generates the phase-A, phase-B, phase-C and phase-D signals.

FIG. 7 is a block diagram of one embodiment of the pulse generator 170 that generates the delay signals labeled phase-A, phase-B, phase-C and phase-D on lines 180, 182, 184 and 186 respectively. In order to provide a variable delay for the return of the read acknowledge signal on line 136, a plurality of delay pulses are provided, one of which is selected by the variable read acknowledge logic 138. Although the pulse generator 170 could generate only one delay signal, the generation of a plurality of delay signals provides the option of selecting any one of the delay signals. The advantage of selecting any one of the delay signals is that each delay signal has a triggering pulse occurring at a different time, as measured from the read request signal on line 134. Therefore, the delay signal having the desired delay can be selected.

The pulse generator 170 of FIG. 7 includes four D-type flip-flops for generating four staggered delay signals. Flip-flop 220 generates the phase-A signal on line 180, flip-flop 222 generates the phase-B signal on line 182, flip-flop 224 generates the phase-C signal on line 184, and flip-flop 226 generates the phase-D signal on line 186. The read request signal on line 134 is the essential input to the D-input of flip-flop 220. The read request signal is logically AND-ed with the ready signal from line 140 at AND gate 230, which is then latched by latch 232 to generate the input pulse signal on line 234. The ready signal on line 140 indicates that the SLC 120 is ready to provide more read data, and therefore is essentially used as an enable signal to the pulse generator 170. The input pulse signal on line 234 is therefore the actual signal that is inputted to the flip-flop 220. The occurrence of the clock signal on line 228 latches the input pulse signal from line 234 at the Q-output of flip-flop 220. This output is coupled to the D-input of flip-flop 222, whose Q-output is coupled to the D-input of flip-flop 224. The Q-output of flip-flop 224 is coupled to the D-input of flip-flop 226. This daisy-chained configuration provides staggered delay signals represented by the phase-A, phase-B, phase-C and phase-D signals on lines 180, 182, 184 and 186 respectively.

It should be recognized that the pulse generator 170 can take other forms without departing from the scope of the invention. For example, digital counters or multiple synchronized offset clock signals could also produce the staggered delay signals.

Figure 8:
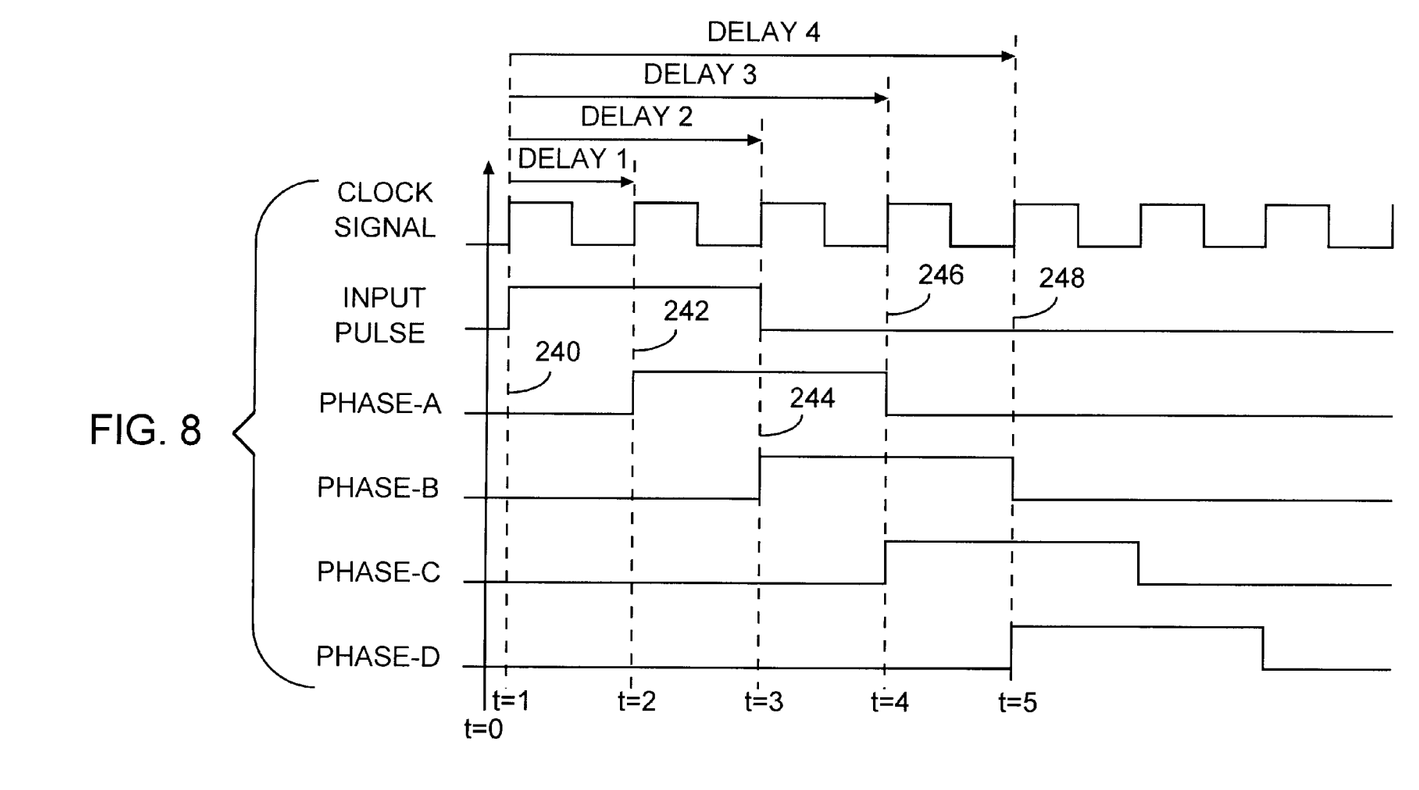
FIG. 8 is waveform diagram showing the phase-A, phase-B, phase-C and phase-D signals in relation to the triggering read request signal.

FIG. 8 is waveform diagram showing the phase-A, phase-B, phase-C and phase-D signals in relation to the triggering input pulse signal, which is shown on line 234 of FIG. 7. The input pulse signal becomes active at time t=1, which is represented by line 240. The input pulse signal, as a result of the read request signal, remains active for two clock periods in the preferred embodiment of the invention. While the input pulse signal is active, another active clock pulse occurs at time t=2, which is represented by line 242. At this time, the phase-A signal on line 180 becomes active, as the input pulse signal is latched at the output of flip-flop 220. The phase-B signal on line 182 becomes active at time t=3, shown corresponding to line 244. The phase-C signal on line 184 becomes active at time t=4, represented by line 246. Finally, the phase-D signal becomes active at time t=5 which corresponds to line 248.

Referring now to FIGS. 6, 7 and 8, it can be seen that where a small delay is required, the phase-A signal (corresponding to delay 1 of FIG. 8) can be selected by asserting the level-A signal on line 190 from the static scan latch 208. Where the clock speed in clock domain 114 becomes comparatively faster than the clock speed in clock domain 110, larger delays may be necessary. In this instance, the phase-B signal (corresponding to delay 2) can be selected by asserting the level-B signal on line 192 from the static scan latch 210. For yet a larger delay in returning the read acknowledge signal on line 136, the phase-C signal (corresponding to delay 3) can be selected by asserting the level-C signal on line 196 from the static scan latch 212. Finally, the largest delay for the variable read acknowledge logic 138 of FIG. 6 is selected by asserting the level-D signal on line 200 from the static scan latch 214. Where additional delays are desired, the variable read acknowledge logic 138 can be expanded to accommodate more static scan latches and AND-gates, and the pulse generator 170 can be expanded to generate a corresponding number of additional delay signals.

The invention has been described in its presently contemplated best mode, and it is clear that it is susceptible to various modifications, modes of operation and embodiments, all within the ability and skill of those skilled in the art and without the exercise of further inventive activity. Accordingly, what is intended to be protected by Letters Patents is set forth in the appended claims.

What is claimed is:

1. An apparatus for limiting the data transfer rate between first and second synchronous circuits, wherein the first synchronous circuit includes a memory device and the second synchronous circuit includes one or more data-requesting devices, and wherein the first synchronous circuit operates at a greater clock speed than a clock speed of the second synchronous circuit, the apparatus comprising:

read request buffer means for queuing read request signals from the one or more data-requesting devices, and for outputting a first one of the read request signals to the memory device;

pulse generating means, coupled to the read request buffer means, for receiving the first read request signals, and for generating a plurality of pulses in response to the first read request signal, wherein each of the pulses occurs at different predetermined delays relative to the first read request signal;

read acknowledge selection means, coupled to the pulse generating means, for selecting one of the pulses as a read acknowledge signal; and buffer enable means, coupled to the read request buffer means and the read acknowledge selection means, for enabling the read request buffer means to output a subsequent one of the read request signals upon receipt of the read acknowledge signal.

2. The apparatus as in claim 1, wherein the pulse generating means comprises a digital counter having a counter output terminal for each of the plurality of pulses to output the plurality of pulses.

3. The apparatus as in claim 1, wherein the pulse generating means comprises a series of daisy-chained flip-flops, each of the daisy-chained flip-flops having an output terminal to output one of the plurality of pulses.

4. The apparatus as in claim 1, wherein the pulse generating means comprises a plurality of signal generators, wherein each of the signal generators generates one of the pulses, and wherein each of the pulses is offset in time from the other ones of the pulses.

5. The apparatus as in claim 1, wherein the read acknowledge selection means comprises selection modification means for selecting, via input of a selection signal, a different one of the pulses as the read acknowledge signal.

6. The apparatus as in claim 5, wherein the selection modification means comprises means for dynamically selecting the different one of the pulses as the read acknowledge signal.

7. The apparatus as in claim 5, wherein the selection modification means comprises means for selecting the different one of the pulses as the read acknowledge signal upon initialization.

8. An apparatus for limiting the data transfer rate between first and second synchronous circuits, wherein the first synchronous circuit includes a memory device and the second synchronous circuit includes one or more data-requesting devices, and wherein the first synchronous circuit operates at a greater clock speed than a clock speed of the second synchronous circuit, the apparatus comprising:

read request buffer means for queuing read request signals from the one or more data-requesting devices, and for outputting a first one of the read request signals to the memory device;

pulse generating means, coupled to the read request buffer means, for receiving the first read request signals, and for generating a plurality of pulses in response to the first read request signal, wherein each of the pulses occurs at a predetermined delay from the first read request signal;

read acknowledge selection means, coupled to the pulse generating means, for selecting one of the pulses as a read acknowledge signal, the read acknowledge selection means comprising selection modification means for selecting a different one of the pulses as the read acknowledge signal, and wherein the selection modification means comprises static scan latching means for receiving a plurality of input signals, and for enabling the different one of the pulses to be output as the read acknowledge signal in response to the input signals; and buffer enable means, coupled to the read request buffer means and the read acknowledge selection means, for enabling the read request buffer means to output a subsequent one of the read request signals upon receipt of the read acknowledge signal.

9. The apparatus as in claim 8, wherein the static scan latching means comprises input means for receiving the plurality of input signals as a serial stream of scan data.

10. A system for allowing data transfers from a memory device in a first clock domain to one or more requesting input/output devices in a second clock domain, the first clock domain having an operating clock speed greater than the operating clock speed of the second clock domain, the system comprising:

(a) a bridging circuit, coupled to the one or more requesting input/output devices to receive data request signals therefrom;

(b) a data uplink module, coupled between the bridging circuit and the memory device, having a request buffer to queue the data request signals from the bridging circuit, and further having an uplink output terminal for outputting the data request signals to the memory device; and (c) a data downlink module coupled to the bridging circuit and the memory device to transfer requested data from the memory device to the bridging circuit, the data downlink module comprising:

(i) acknowledge signal generation means, coupled to the data uplink module, for receiving one of the data request signals, and for generating a read acknowledge signal a predetermined time after receiving the data request signal; and (ii) request buffer enable means, coupled to the acknowledge signal generation means and the request buffer, for receiving the read acknowledge signal, and for enabling the request buffer to output another one of the data request signals to the memory device.

11. The system as in claim 10, wherein the acknowledge signal generation means comprises pulse generation means for generating a plurality of pulses, each of the plurality of pulses being delayed a different predetermined time from the occurrence of the data request signal.

12. The system as in claim 11, further comprising pulse selection means, coupled to the acknowledge signal generation means, for selecting one of the pulses as the read acknowledge signal.

13. The system as in claim 12, wherein the pulse generation means comprises a digital counter having a counter output terminal for each of the plurality of pulses to output the plurality of pulses.

14. The system as in claim 12, wherein the pulse generation means comprises a series of daisy-chained flip-flops, each of the daisy-chained flip-flops having an output terminal to output one of the plurality of pulses.

15. The system as in claim 12, wherein the pulse generation means comprises a plurality of signal generators, each to generate one of the pulses, and wherein each of the pulses is offset in time from the other ones of the pulses.

16. The system as in claim 12, wherein the pulse selection means comprises selection modification means for selecting a different one of the pulses as the read acknowledge signal.

17. The system as in claim 16, wherein the selection modification means comprises means for selecting the different one of the pulses as the read acknowledge signal upon initialization of the system.

18. The system as in claim 16, wherein the selection modification means comprises static scan latching means for receiving a plurality of input signals, and for enabling the different one of the pulses to be output as the read acknowledge signal in response to the input signals.

19. The system as in claim 18, wherein the static scan latching means comprises input means for receiving the plurality of input signals as a serial stream of scan data.

20. A method for allowing data transfers from a memory device to one or more data requesting devices residing in first and second clock domains respectively, wherein the first clock domain operates at a faster clock speed than the second clock domain, the method comprising the steps of:
(a) sending read request signals from the data requesting devices to the memory device and a data transfer module;
(b) transferring requested data from the memory device to the data transfer module upon receipt of one of the read request signals at the memory device;
(c) asserting a read acknowledge signal a predetermined time after the receipt of the read request signal at the data transfer module, and wherein the step of asserting a read acknowledge signal comprises the step of adjusting the predetermined time proportionally with an amount by which the clock speed of the first clock domain exceeds the clock speed of the second clock domain; and
(d) sending another one of the read request signals from the data requesting devices to the memory device and the data transfer module upon assertion of the read acknowledge signal.

21. The method of claim 20, wherein the step of adjusting the predetermined time comprises the step of setting the predetermined time to an optimum time wherein the memory device's data transfer rate is at most the rate at which the data requesting devices can receive the requested data.

22. A method for allowing data transfers from a memory device to one or more data requesting devices residing in first and second clock domains respectively, the method comprising the steps of:
(a) sending read request signals from the data requesting devices to the memory device and a data transfer module;
(b) transferring requested data from the memory device to the data transfer module upon receipt of one of the read request signals at the memory device;
(c) asserting a read acknowledge signal a predetermined time after the receipt of the read request signal at the data transfer module, wherein the step of asserting a read acknowledge signal comprises the steps of:
generating a plurality of pulses in response to the receipt of the read request signal; and
selecting one of the pulses as the read acknowledge signal; and
(d) sending another one of the read request signals from the data requesting devices to the memory device and the data transfer module upon assertion of the read acknowledge signal.

23. The method of claim 22, further comprising the step of asserting each of the pulses at a different predetermined time after the receipt of the read request signal at the data transfer module.

24. The method of claim 22, wherein the step of selecting one of the pulses as the read acknowledge signal comprises the step of modifying the selection by selecting a different one of the pulses as the read acknowledge signal.

25. A data controller for controlling the asynchronous transmission of data between first and second circuits respectively operating in first and second clock domains having dissimilar synchronous clock rates, wherein the second circuit includes a memory device to store data, the data controller comprising:
a read request buffer within the second clock domain coupled to receive and queue data read requests from the first circuit, and to output the data read requests to the memory unit in response to a request enable signal;
a pulse generation unit capable of providing a plurality of request delay signals, wherein each of the request delay signals includes a trigger signal that is time-shifted from each of the other request delay signals relative to the data read request;
a selection circuit coupled to the pulse generation unit to select one of the request delay signals corresponding most closely to a time differential between the dissimilar synchronous clock rates, and to output a read acknowledge signal in response thereto;
an enable circuit coupled to receive the read acknowledge signal from the selection circuit, and to generate the request enable signal to output a subsequent data read request from the read request buffer in response thereto, thereby allowing the subsequent data read request to request new data from the memory device.

26. The data controller as in claim 25, wherein the first circuit comprises one or more input/output devices that initiate the data read requests and receive requested data from the memory device.

27. The data controller as in claim 25, wherein:
the memory unit is configured and arranged to provide a read ready signal indicative of the memory device's availability to receive another data read request; and
the pulse generation circuit comprises a pulse enable circuit to output the request delay signals in response to the data request signal only when the read ready signal indicates that the memory device is available to receive another data read request.

28. The data controller as in claim 25, wherein the selection circuit comprises:

a plurality of AND-gates, each coupled to receive one of the request delay signals and one selection enable signal; and a configurable selection enable circuit coupled to each of the AND-gates to provide the selection enable signal;

wherein an asserted one of the selection enable signals enables a corresponding one of the AND-gates to output the request delay signal as the read acknowledge signal.

29. The data controller as in claim 28, wherein the configurable selection enable circuit comprises a scan latch circuit including a plurality of serially-connected scan latches that shift a predetermined pattern into the scan latch circuit.

* * * * *